(12) United States Patent
Dunn et al.

(10) Patent No.: US 7,262,484 B2
(45) Date of Patent: Aug. 28, 2007

(54) STRUCTURE AND METHOD FOR PERFORMANCE IMPROVEMENT IN VERTICAL BIPOLAR TRANSISTORS

(75) Inventors: James S. Dunn, Jericho, VT (US); David L. Harame, Essex Junction, VT (US); Jeffrey B. Johnson, Essex Junction, VT (US); Alvin J. Joseph, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,361

(22) Filed: May 9, 2005

(65) Prior Publication Data

US 2006/0249813 A1 Nov. 9, 2006

(51) Int. Cl.
*H01L 29/73* (2006.01)

(52) U.S. Cl. .............. 257/593; 257/565; 257/E29.174; 438/309

(58) Field of Classification Search .............. 257/190, 257/565, 197, E29.193, 593, E29.174; 438/309, 438/938
See application file for complete search history.

(56) References Cited

U.S. PATENT DOCUMENTS

| | | | |
|---|---|---|---|
| 4,969,031 A * | 11/1990 | Kobayashi et al. ........... | 257/64 |
| 5,241,197 A | 8/1993 | Murakami et al. | |
| 5,512,496 A * | 4/1996 | Chau et al. .................. | 438/315 |
| 5,643,805 A | 7/1997 | Ohta et al. | |
| 5,702,958 A * | 12/1997 | Liu et al. ..................... | 438/309 |
| 5,859,447 A * | 1/1999 | Yang et al. .................. | 257/197 |
| 6,399,993 B1 | 6/2002 | Ohnishi et al. | |
| 6,525,349 B2 | 2/2003 | Harmann | |
| 6,649,492 B2 | 11/2003 | Chu et al. | |
| 6,717,216 B1 * | 4/2004 | Doris et al. .................. | 257/347 |

(Continued)

FOREIGN PATENT DOCUMENTS

FR 2834129 6/2003

(Continued)

OTHER PUBLICATIONS

English Language Abstract of FR 2 834 129. Jun. 27, 2003.

(Continued)

*Primary Examiner*—Eugene Lee
*Assistant Examiner*—William Kraig
(74) *Attorney, Agent, or Firm*—Anthony J. Canale; Greenblum & Bernstein, P.L.C.

(57) ABSTRACT

A method of forming a semiconductor device having two different strains therein is provided. The method includes forming a strain in a first region with a first straining film, and forming a second strain in a second region with a second straining film. Either of the first or second strains may be either tensile or compressive. Additionally the strains may be formed at right angles to one another and may be additionally formed in the same region. In particular a vertical tensile strain may be formed in a base and collector region of an NPN bipolar transistor and a horizontal compressive strain may be formed in the extrinsic base region of the NPN bipolar transistor. A PNP bipolar transistor may be formed with a compression strain in the base and collector region in the vertical direction and a tensile strain in the extrinsic base region in the horizontal direction.

10 Claims, 5 Drawing Sheets

U.S. PATENT DOCUMENTS

| | | | |
|---|---|---|---|
| 7,074,623 B2 * | 7/2006 | Lochtefeld et al. | 438/3 |
| 7,102,205 B2 * | 9/2006 | Chidambarrao et al. | 257/592 |
| 7,118,999 B2 * | 10/2006 | Yang et al. | 438/586 |
| 7,153,753 B2 * | 12/2006 | Forbes | 438/404 |
| 2003/0160300 A1 | 8/2003 | Takenanka et al. | |
| 2003/0168659 A1 * | 9/2003 | Lal et al. | 257/49 |
| 2003/0213977 A1 * | 11/2003 | Toyoda et al. | 257/197 |
| 2004/0063300 A1 | 4/2004 | Chi | |
| 2004/0212035 A1 * | 10/2004 | Yeo et al. | 257/510 |
| 2004/0214401 A1 * | 10/2004 | Krueger et al. | 438/317 |
| 2004/0232513 A1 * | 11/2004 | Chi et al. | 257/510 |
| 2005/0104160 A1 * | 5/2005 | Ahmed et al. | 257/565 |
| 2006/0019458 A1 * | 1/2006 | Chidambarrao et al. | 438/309 |

FOREIGN PATENT DOCUMENTS

| | | |
|---|---|---|
| JP | 58-093272 | 6/1983 |
| JP | 3-187269 | 8/1991 |
| JP | 8-181151 | 7/1996 |

OTHER PUBLICATIONS

English Language Abstract of JP 8-181151. Jun. 27, 1996.
English Language Abstract of JP 58-093272. Jun. 2, 1983.
English Language Abstract of JP 3-187269. Aug. 15, 1991.

* cited by examiner

US 7,262,484 B2

STRUCTURE AND METHOD FOR PERFORMANCE IMPROVEMENT IN VERTICAL BIPOLAR TRANSISTORS

FIELD OF THE INVENTION

The invention relates to semiconductor devices, and more particularly to strained films in semiconductor devices including bipolar transistors and method of manufacture.

BACKGROUND DESCRIPTION

As semiconductor device applications are expanded, a need for devices having a higher frequency response has arisen. For example, present generation bipolar devices typically have power-gain cut off frequencies ($f_{max}$) of about 350 GigaHertz (GHz). Consequently, the maximum frequency where bipolar devices provide a power gain greater than one is about 350 GHz. The maximum current gain cut-off frequency ($f_T$) of such devices is similarly limited to around 300 GHz. Furthermore, the $f_{max}$ of a transistor is an important device parameter to maximize and is especially relevant to RF applications.

The power-gain cut-off frequency of a bipolar device is influenced by a number of factors, particularly, the base resistance ($R_B$), the capacitance between the collector and the base ($C_{CB}$), and its $f_T$. The $f_T$ is influenced by the transit time of carriers through emitter, base, and collector regions. Typically, the transit-time in the base and collector regions dominate the overall carrier transit-time, and should be minimized.

In order to maximize the $f_{max}$, the product of $R_B$ and $C_{CB}$ may be reduced, and the $f_T$ of the transistor may be increased. An increase in $f_T$ can be achieved by reducing the base transit-time as well as the collector transit-time. Traditional methods of improving the carrier transit time in the base layer include reducing the base layer thickness and increasing the Ge-induced built-in electric field. Similarly, the collector-base transit-time is traditionally addressed by reducing the thickness and resistance of the collector and by increasing the collector doping concentration ($N_C$). However, increasing $N_C$ also increases the capacitance between the base and the collector and thus provides only a marginal benefit to $f_{max}$ improvement.

Accordingly, traditional dimensional scaling approaches to improve $f_T$ or $f_{max}$ can create other problems that reduce the benefits of such scaling approaches. Consequently, further improvements to increasing cut-off frequencies may require non-traditional techniques. It is well known in the art that carrier mobility can be improved by inducing strain (tensile or compressive) in a doped silicon material, thereby positively influencing the terminal characteristics of a device that is built thereof. For example, a process-induced tensile strain in the channel of an nFET can create improved electron mobility leading to higher saturation currents. In such situations, a tensile strain in the channel may be induced by applying a compressively strained nitride film close to the active region of the FET.

SUMMARY OF THE INVENTION

In a first aspect of the invention, a method of fabricating a semiconductor, includes doping a region of a structure, and forming a first film on a first portion of the structure to induce a first strain in the first portion. The method also includes forming a second film on a second portion of the structure to induce a second strain in the second portion.

In another aspect of the invention, a method of straining a semiconductor device, includes forming a first straining film on a sidewall of a structure inducing a first strain in an adjoining doped region, and forming a second straining film on a top portion of the structure to induce a second strain in an adjoining region, where the first strain is different from the second strain.

In another aspect of the invention, a semiconductor device includes a collector region, a base region formed on a collector region, and an emitter region formed on the base region. The semiconductor device also includes a first straining film inducing a first strain in an adjoining region formed on a side of the collector region and the base region.

DETAILED DESCRIPTION OF EMBODIMENTS OF THE INVENTION

The invention is directed to creating high speed semiconductor devices, and in particular for creating bipolar devices capable of approaching TeraHertz (THz) frequency operation. Embodiments of the invention allow such high frequency response possibilities by utilizing strained films that induce strain in doped semiconductor regions which enable the reduction of parasitic resistance and transit times within certain regions of the device without increasing unwanted side-effects. It should be noted that stress and strain, and stressing and straining are proportional to one another based on Young's Modulus, and the terms may be used interchangeably herein. However, for simplicity, the term "strain" will be used throughout. Embodiments of the invention combine different films inducing either different types of strain in a semiconductor region and/or different orientations of strain in a region adjacent to the strain film that positively influences the carrier mobility in the device. For example, for a NPN bipolar device, a tensile strain can be induced in the base and the collector, while simultaneously inducing a compressive strain in the extrinsic base region of the device. Accordingly, simultaneous improvement in collector transit time, collector-base transit time, cut-off frequency for current gain and resistance in the base are realized without an increase in unwanted parasitic effects.

Figure 1:
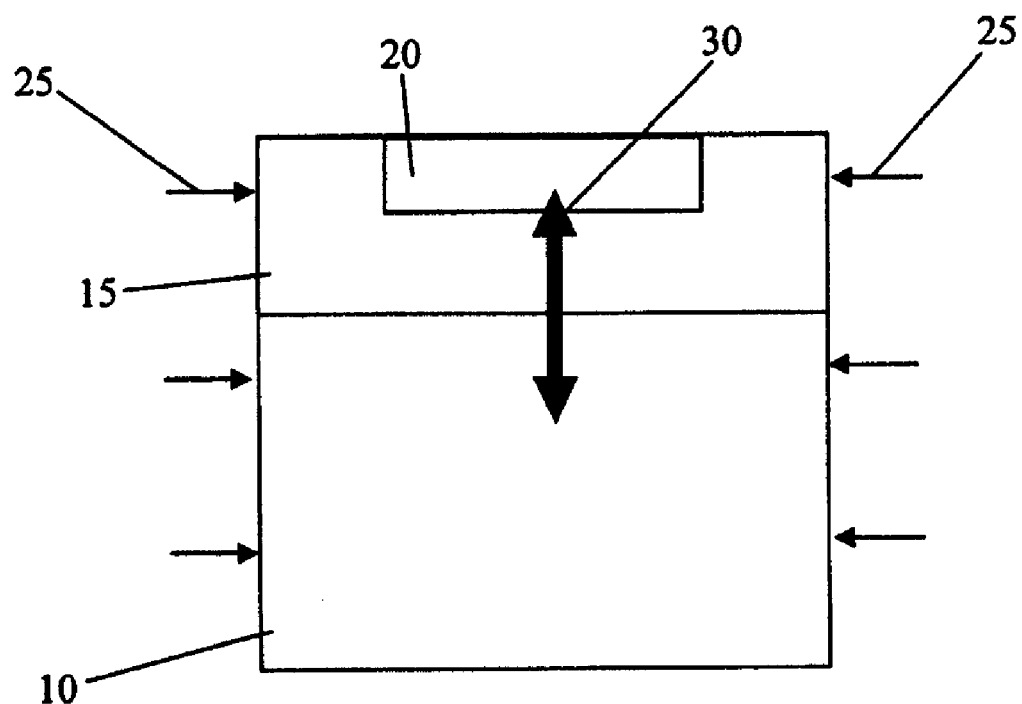
FIG. 1 illustrates strain in a semiconductor device.

Referring to FIG. 1, a schematic of a semiconductor device is shown having a collector 10 with a base 15 formed thereon. An emitter 20 is formed on top of the base 15. Also shown is an applied compressive strain 25 being applied to sidewalls of the collector 10, base 15 and emitter 20. The applied compressive strain 25 applied to the sides of the device induces an induced tensile strain 30 within the collector 10, base 15 and emitter 20, in the vertical direction as shown. The induced tensile strain 30 is generally at a right angle to applied compressive strain 25. Accordingly, the induced tensile strain 30 causes low field electron mobility enhancement in a vertical direction, which improves base 15, and collector 10 transit times. Improving the base 15 and collector 15 transit times cause improvements in maximum current gain cutoff frequency $f_T$ with reduced unwanted side effects.

In other words, FIG. 1 shows an external applied compressive strain 25 applied at the sidewall surface induces an induced tensile strain 30 in the semiconductor lattice along the vertical direction. The induced tensile strain 30 spreads from the sidewall edges of the semiconductor to the mid region, where the active region of a bipolar may be formed. In the case of an n-doped material, this induced tensile strain 30 will help in improving the electron mobility and reducing the resistance as well as the transit-time.

Figure 2:
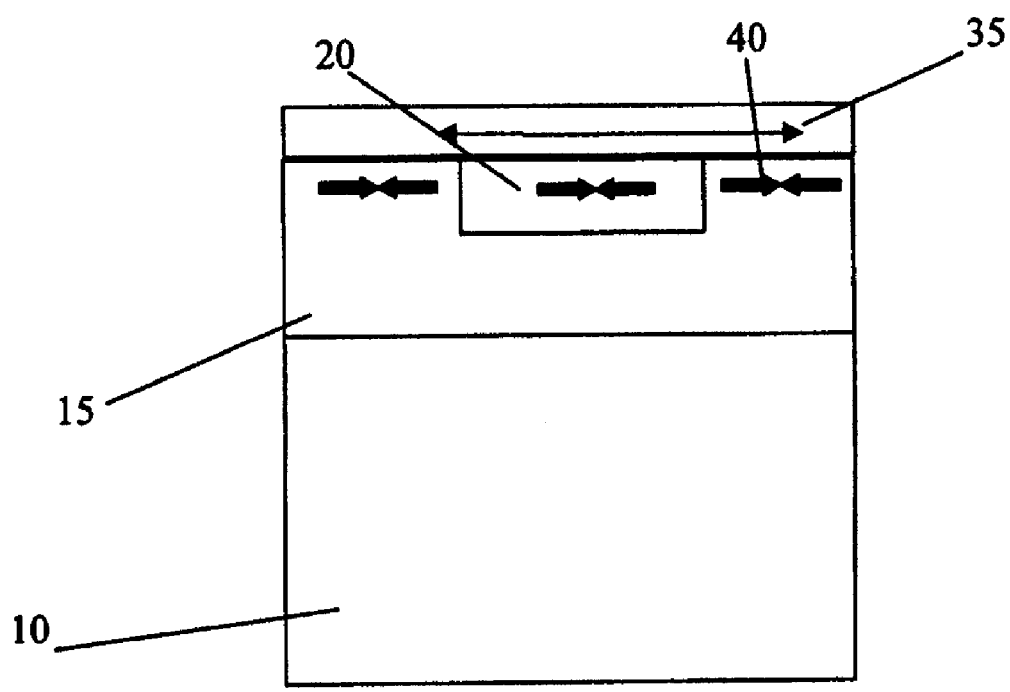
FIG. 2 illustrates strain in a semiconductor device.

Referring to FIG. 2, a schematic of a semiconductor device having a collector 10, base 15, and emitter 20 similar to FIG. 1 is shown. The base 15 and emitter 20 have a film with tensile strain 35 applied on their surface. The film with tensile strain 35 induces a compressive strain 40 within the base 15 and emitter 20, in the horizontal direction as shown. The induced compressive strain 40 is oriented in the same direction as the applied tensile strain 35. The induced compressive strain 40 may be located in the extrinsic region of the base 15 (outside the regions of the base 15 rather than under the emitter region 15). Consequently, the induced compressive strain 40 enhances low field hole mobility in the horizontal direction which improves base 15 resistance and improves the maximum frequency $f_{max}$ of the device, reduced unwanted side effects.

In other words, FIG. 2 shows an external film with tensile strain 35 applied at a top surface of a semiconductor device which induces a compressive strain 40 in the semiconductor lattice along a horizontal direction. In the case of an p-doped material, this induced compressive strain 40 will help in improving the hole mobility and reducing the resistance.

Figure 3:
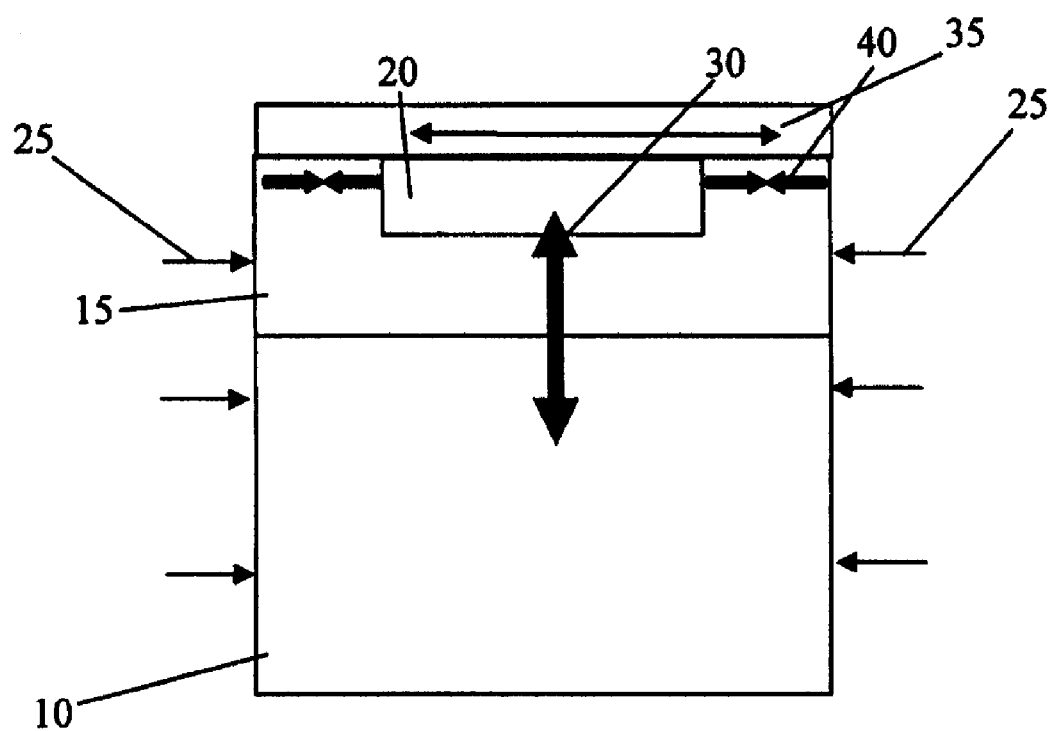
FIG. 3 illustrates a combination of the strain components for a semiconductor device.

Referring to FIG. 3, a schematic of a semiconductor device having a collector 10, base 15, and emitter 20 similar to FIG. 1 is shown. The collector 10, base 15, and emitter 20 have an applied compressive strain 25 applied to the sides thereof. The applied compressive strain 25 induces tensile strain 30 in the semiconductor at right angles to the applied compressive strain 25 within the collector 10, base 15, and emitter 20. A film with tensile strain 35 is also applied along the top of the base 15. The applied film with tensile strain 35 induces compressive strain 40 in the semiconductor along the top of the base 15. Consequently, an induced tensile strain through the collector 10, base 15, and emitter 20 can be created simultaneously with an induced compressive strain 40 through the top of the base 15. The induced tensile strain 30 is substantially at a right angle to the induced compressive strain 40. In other words, the induced tensile strain 30 is in a vertical direction, and the induced compressive strain 40 is in a horizontal direction.

In other words, FIG. 3 shows improving electrical performance of a semiconductor device by an appropriate application of strain components to the semiconductor device, such as, for example, a vertical NPN bipolar transistor in which hole transport is substantially in a horizontal direction and electron transport is in a vertical direction.

Figure 4:
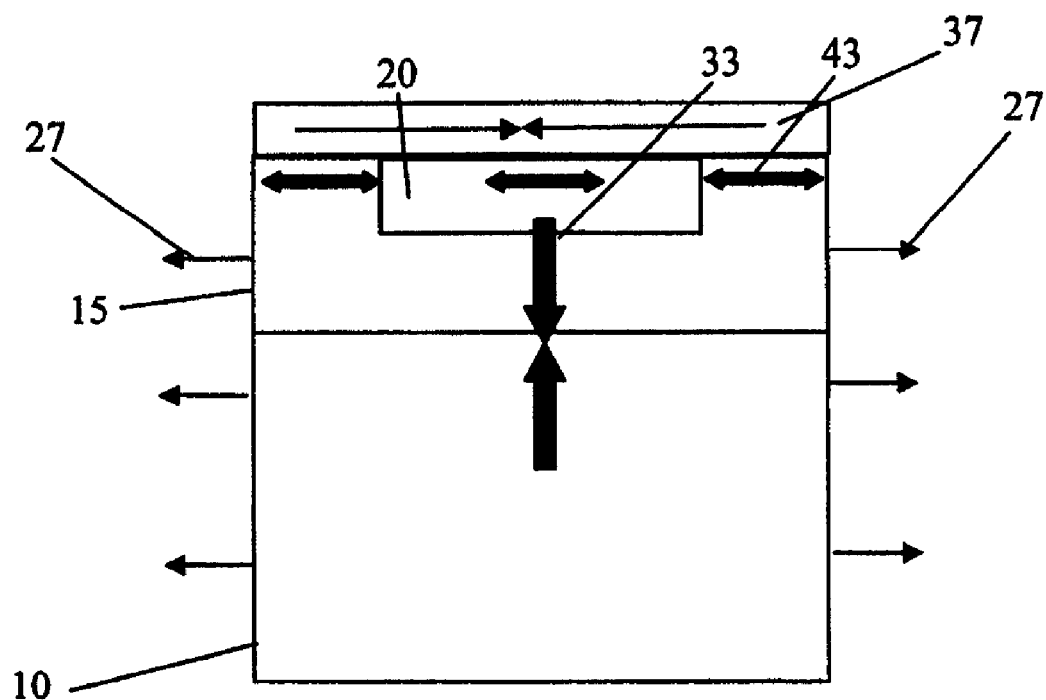
FIG. 4 illustrates a combination of the strain components for a semiconductor device.

Referring to FIG. 4, a collector 10, base 15, and emitter 20 are shown, similar to FIG. 1. The collector 10, base 15, and emitter 20 have an applied tensile strain 27 applied to their sides. The applied tensile strain 27 induces a compressive strain 33 within the collector 10, base 15, and emitter 20. The induced compressive strain 33 is substantially at a right angle to the applied tensile strain 27. Additionally, a compressive strain 37 is applied near the top of the base 15, to induce a horizontal tensile strain in the base region 15.

The applied film with compressive strain 37 induces a tensile strain 43 along a top of the base 15. Accordingly, an induced compressive strain 33 and an induced tensile strain 43 are simultaneously created inside the collection 10, base 15, and emitter 20 assembly. The induced compressive strain 33 is generally at a right angle to the induced tensile strain 43. Additionally, the induced compressive strain 33 is generally in a vertical direction, while the induced tensile strain 43 is generally in a horizontal direction.

One method of inducing a strain within regions of a semiconductor device includes forming an applied strain on a surface of a region of the semiconductor device by application of a straining film. Typical thicknesses of such straining films, whether compressive or tensile, may range from about 10 nm to about 200 nm, and more typically between about 40 nm to about 60 nm. After application, the applied straining film is allowed to relax thereby inducing an opposite type of strain that is located within the region of the semiconductor device that is contacted by the applied film.

Accordingly, FIG. 4 shows improving electrical performance by an appropriate application of strain components for a semiconductor device, such as, for example, a vertical PNP bipolar transistor, in which the electron transport is substantially horizontal and the hole transport is substantially vertical.

Figure 5:
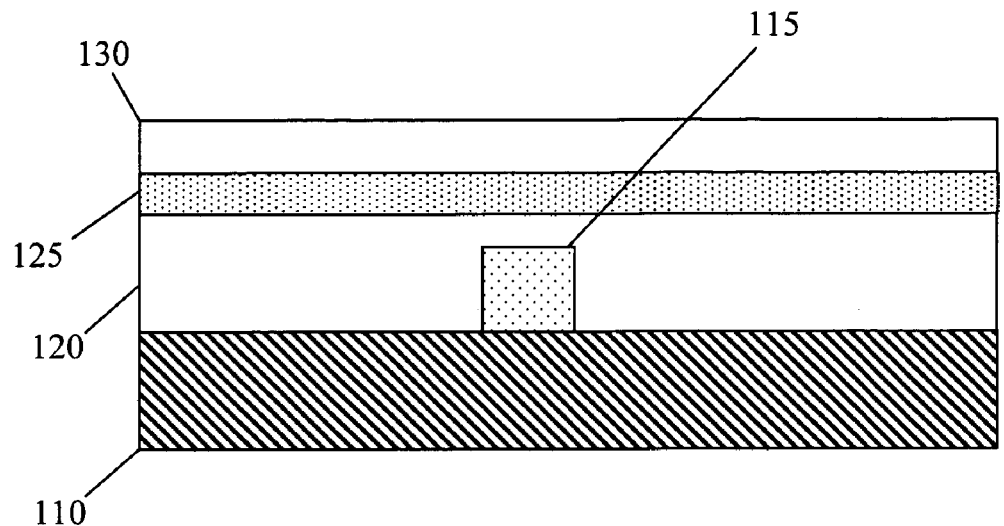
FIG. 5 illustrates a step of an embodiment of forming a bipolar transistor in accordance with the invention.

Referring to FIG. 5, a starting structure is shown having a collector 115 formed on a heavily doped subcollector region 110 that is formed on top of a silicon substrate (not shown). The collector 115 is either patterned or has a blanket doping like an N-type doping such as, for example, arsenic or phosphorus. Also, positioned on top of the subcollector 110 and surrounding the collector 115 is a very lightly doped or neutral region 120. A base 125 is grown on top of the lower neutral doped region 120 using an epitaxial process. The base 125 can be formed by any of the epitaxial processes well known in the art.

The base 125 receives a P-type doping such as, for example, boron or indium. The base 125 can be made of a compound semiconductor, such as, silicon-germanium or silicon-germanium-carbon, using well known techniques in the art. Additionally, on top of the base 125 is an upper emitter cap region 130, which may remain undoped or lightly doped. The emitter cap region 130 can be formed by a low temperature epitaxial process.

Figure 6:
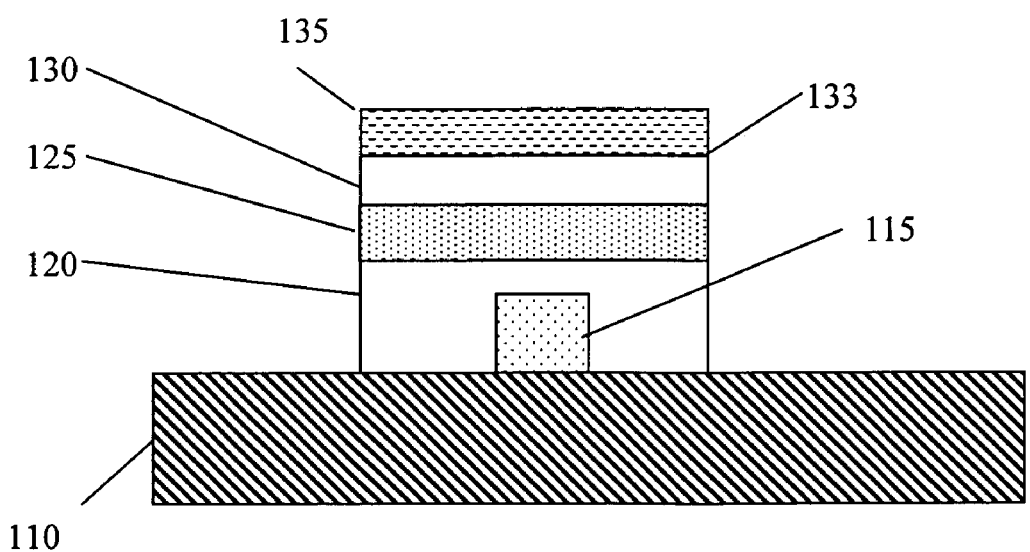
FIG. 6 illustrates a step of an embodiment of forming a bipolar transistor in accordance with the invention.

Referring to FIG. 6, a strain film 135 is formed on a top of the emitter cap region 130. In one embodiment, the strain film 135 may sit directly on top of a thin oxide region 133 that is added above the emitter cap region 130. The strain film 135 is typically less than 1000 angstroms (Å) thick; however, other film thicknesses are contemplated for use by the invention. The strain film may include any kind of film or layer which causes a strain to arise in the region adjacent to the strain film. In one embodiment, the strain film may be a film applied having an internal first strain during application where the internal strain is allowed to relax after the film is applied thereby imparting an induced strain to the underlying material on which the strain film is deposited. For example, a tensile strain film is applied and allowed to relax, squeezing the adjoining substrate causing compressive strain in the substrate, i.e., a tensile film induces a compressive strain in the silicon substrate.

The strain film 135 may be formed from a nitride, where the composition of the nitride is suitably altered to produce a film having a strain therein. In one embodiment the strain film 135 provides a horizontal strain component. It should be noted that the strain induced by the strain film 135 may be in either the horizontal or the vertical direction. It should also be noted that the strain in the strain film 135 may be either compressive or tensile. After the strain film 135 is formed, outlying portions of the strain film 135, upper doped region 130, base 125, and lower neutral doped region 120 are etched using known processes such as RIE.

Figure 7:
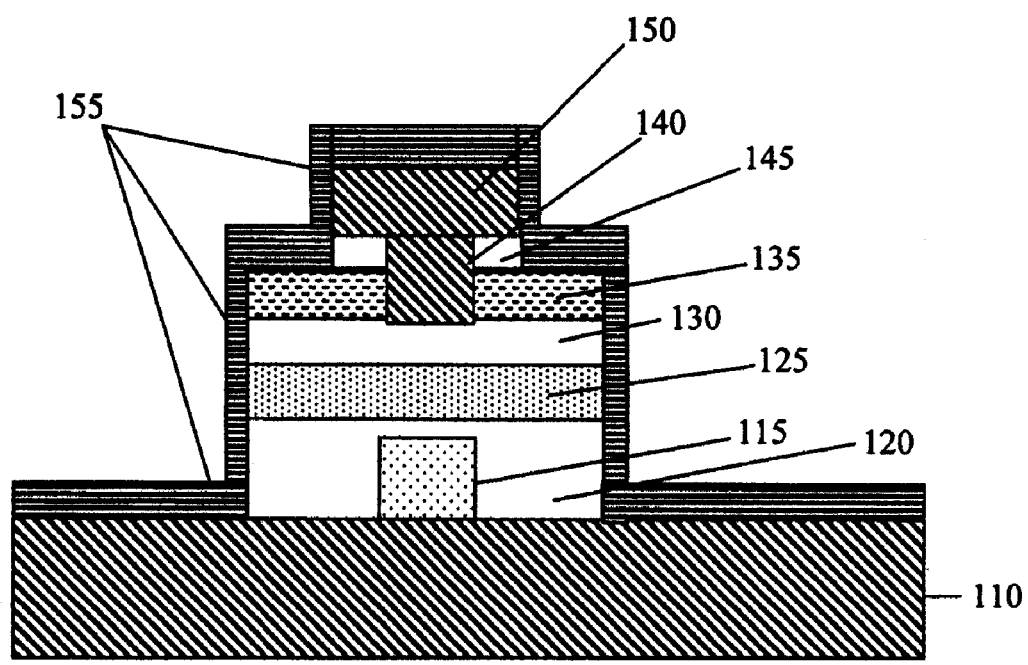
FIG. 7 illustrates a step of an embodiment of forming a bipolar transistor in accordance with the invention.

Referring to FIG. 7, an emitter oxide 145 is formed over the strain film 135. The emitter oxide 145 may be formed by any process suitable for depositing an oxide. The emitter oxide 145 is patterned after deposition. After the emitter oxide 145 is patterned, a hole is etched through the emitter oxide 145 and the strain film 135 to a top of the upper neutral doped region 130. An emitter hole 140 is formed by any of the processes well known in the art for forming an emitter. In another embodiment, an emitter hole may be patterned directly on top of the strain film 135, without the presence of the oxide film 145.

After the emitter 140 is formed, a polysilicon film 150 is formed over the emitter 140. The polysilicon 150 may be formed by any of the methods well known in the art for depositing polysilicon. The deposited polysilicon 150 may be an in-situ doped using dopant such as, Arsenic or Phosphorus for n-type and Boron for p-type, and may be realigned to the exposed silicon region on 130 and within the emitter hole 140. Such techniques are well known in the art. The emitter poly is patterned and etched using standard techniques know in the industry. The poly/oxide stack or the poly film is etched and stopped on strain film 135. A strain film 155 is then conformally deposited over the structure including the polysilicon 150, the strain film 135, the sides of the emitter cap region 130, the base 125, and the lower neutral doped region 120. In one embodiment, the externally applied strain film 155 induces a vertical strain component in the semiconductor.

Additionally, embodiments may include the strain film 155 as a compressive applied strain film when the strain film 135 is a tensile strain film used in NPN devices. Alternatively, the strain film 155 may be a tensile strain film when the strain film 155 is used in PNP devices. In one example, an NPN structure will use a compressive strain film in the silicon mesa sidewall regions and a tensile strain film in the extrinsic base regions. Thus, in these embodiments: i) low field electron mobility enhancement is provided in the vertical direction can be provided for improved base and collector transit times (utilizing compressive strain film in the base and collector region); and ii) low field hole mobility enhancement is provided in the horizontal direction for improved base resistance (utilizing tensile strain film in the extrinsic base region). For example, this is shown in FIGS. 1, 2, and 3, respectively.

Figure 8:
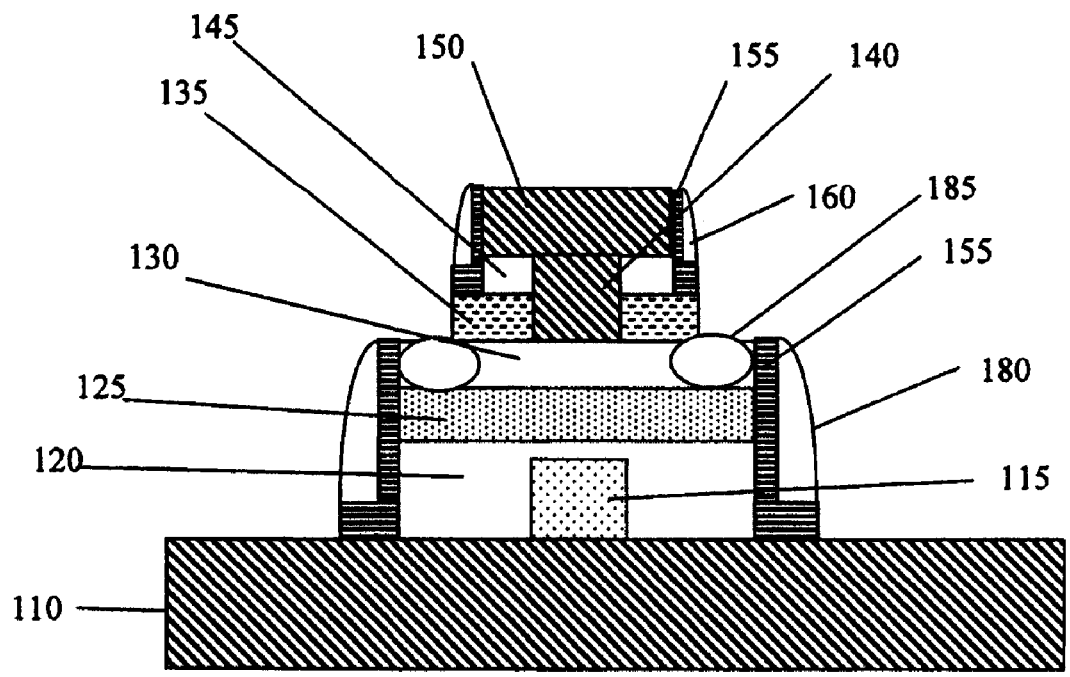
FIG. 8 illustrates a step of an embodiment of forming a bipolar transistor in accordance with the invention.

Referring to FIG. 8, an oxide layer is deposited over the vertical strain film 155 by any of the methods well know in the art for depositing an oxide film and is then isotropically etched to leave an oxide spacer 180 on a lower portion of the vertical strain film 155 and an upper oxide shoulder 160 on an upper portion of the vertical strain film 155. Once the lower oxide shoulder 180 and the upper oxide shoulder 160 have been formed, exposed portions of the vertical strain film 155 are removed using any of the etching process well known in the art for removing such a film.

By depositing and removing preselected portions of the vertical strain film 155, a lower vertical strain portion 165 remains on the sides of the lower neutral doped region 120, base 125 and upper emitter cap region 130. An upper vertical strain film 170 is also formed on a side of the emitter 140, polysilicon 150, emitter shoulder oxide 145, and strain film 135. Additionally, portions of the upper emitter cap region 130 are exposed at the foot of the strain film 135. For example, where an NPN device is being formed, an extrinsic base implant 185 is implanted selectively in the exposed portions of the emitter cap region 130, possibly using a mask step. The extrinsic base region 185 may be formed by implanting Boron (for NPN) dopant with a dose of 1e15 to 1e16 $cm^{-2}$ at an energy of 5-15 keV.

Figure 9:
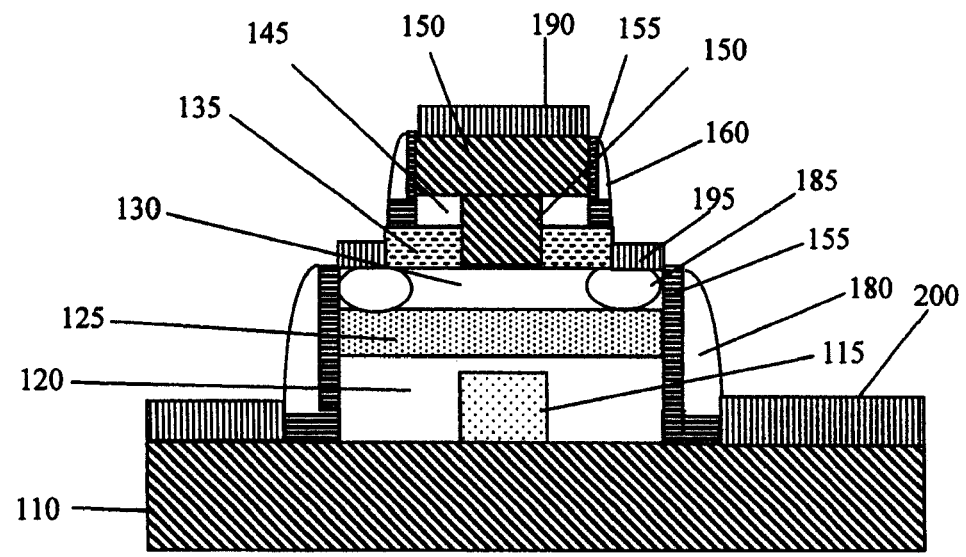
FIG. 9 illustrates a step of an embodiment of forming a bipolar transistor in accordance with the invention.

Referring to FIG. 9, silicide is deposited on the subcollector region 110, the extrinsic base implant 185, and the NP polysilicon 150 to form a collector contact 200, a base contact 195, and an emitter contact 190, respectively. The suicide deposition is a self-aligned salicidation deposition using a salicidation deposition process well known in the art.

Figure 10:
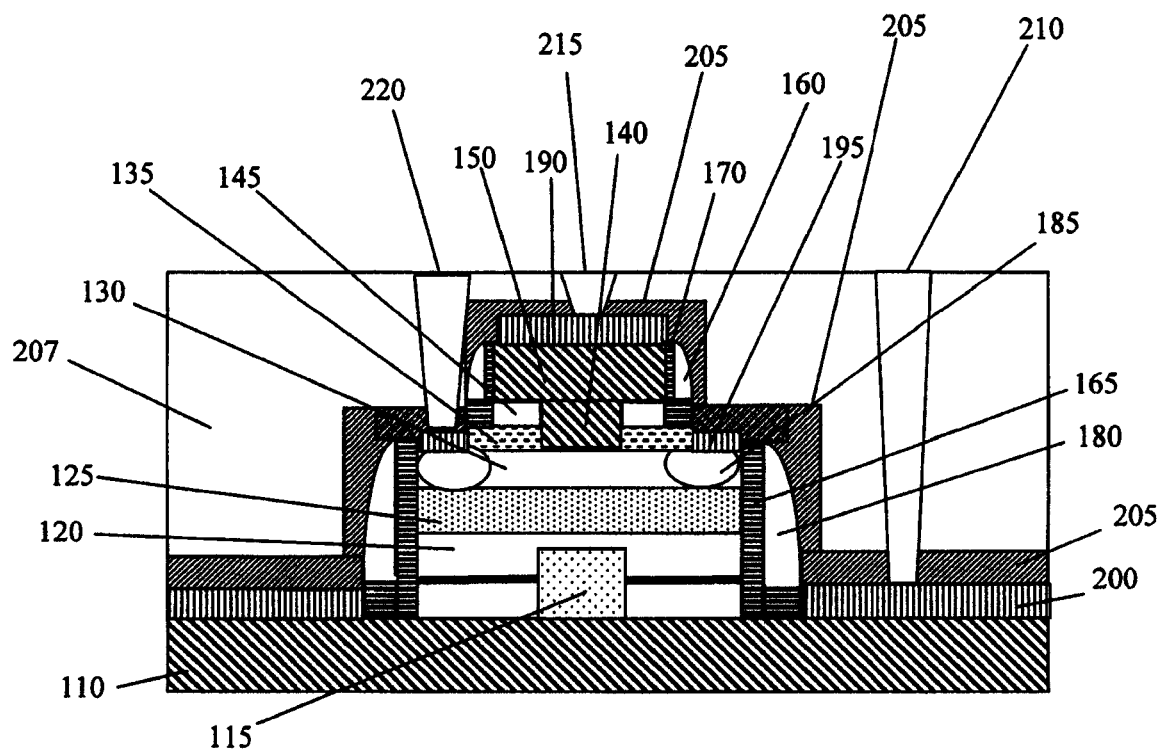
FIG. 10 illustrates a step of an embodiment of forming a bipolar transistor in accordance with the invention.

Referring to FIG. 10, a first dielectric material 205, such as, for example, a nitride material is conformally deposited over the structure. This material is typically used for etch stopping the contacts to the silicided regions, and is well known in the art. Next, the entire structure is covered with a second dielectric material 207 such as, for example, boron phosphate silicate glass, and later planarized using well known techniques in the field such as chemical-mechanical polishing (CMP). Via holes are then etched through the second dielectric 207 and the first dielectric material 205. The via holes are then filled with a conductor, such as, tungsten. In particular, a collector via 210 is formed through the first dielectric material 205 and the second dielectric material 207 to the collector contact 200. A base via 220 is formed through the first dielectric material 205 and the second dielectric 207 to the base contact 195. Additionally, an emitter via 215 is formed through the first dielectric 205 and the second dielectric material 207 to the emitter contact 190.

As discussed above, a semiconductor device, such as, for example, a bipolar device may be formed having two different types of straining films applied thereon. The two different types of straining films are applied to selected areas to cause a pre-selected strain in the respective adjoining areas. It should be noted that either of the straining films may be configured to apply either one of a compression or tension strain or a combination thereof. Additionally, either one of the straining films may be configured to form a strain in a vertical or horizontal direction or virtually any other orientation.

Each of the straining films can be configured and located to strain a particular region of a semiconductor device without straining other regions of the semiconductor device. Consequently, the straining films can be arranged on, for example, an NPN bipolar transistor so that the base and emitter regions receive a tensile strain in the vertical direction, and the extrinsic base region receives a compression strain in the horizontal direction.

Additionally, another example of a semiconductor device which may be formed with the multiple straining films includes, for example, a PNP bipolar transistor where a compressive strain is induced in the base and collector in a vertical direction by one of the straining films and a tensile strain is induced in the horizontal direction in the extrinsic base region by a second straining film. It should be noted that, in general, these two forces may be oriented at right angles to one another and may coexist in the same region due to the right angle orientation of each strain.

It should also be noted that more than two different strains may be applied to the semiconductor device using the methods discussed above. For example, a third strain film may be applied to a particular area of the device to provide a third strain to a selected region of the device. The strain can be either tensile or compressive, and may be oriented in virtually any direction.

While the invention has been described in terms of exemplary embodiments, those skilled in the art will recognize that the invention can be practiced with modifications and in the spirit and scope of the appended claims.

What is claimed is:

1. A semiconductor device, comprising:
   a collector region;
   a base region formed on a collector region;
   an emitter region formed on the base region;
   a first straining film providing a first strain in an adjoining region formed on a side of the collector region and the base region; and
   a second straining film, formed at least partially on the first straining film, providing a second strain in an adjoining region formed on the top of the base region and next to a side of the emitter region, where the first strain is different from the second strain, the first strain is a tensile strain in a substantially vertical direction and the second strain is a compressive strain in a substantially horizontal direction.

2. A semiconductor device, comprising:
   a collector region;
   a base region formed on a collector region;
   an emitter region formed on the base region;
   a first straining film providing a first strain in an adjoining region formed on a side of the collector region and the base region; and
   a second straining film, formed at least partially on the first straining film, providing a second strain in an adjoining region formed on the top of the base region and next to a side of the emitter region, where the first strain is different from the second strain, the first strain is a compressive strain in a substantially vertical direction and the second strain is a tensile strain in a substantially horizontal direction.

3. A semiconductor device, comprising:
   a collector region;
   a base region formed on a collector region;
   an emitter region formed on the base region;
   a first conformal straining film, formed entirely over the base region, providing a first strain in an adjoining region formed on a side of the collector region and the base region; and
   a second straining film providing a second strain in an adjoining region formed on the top of the base region and next to a side of the emitter region, wherein the semiconductor device comprises an NPN transistor and the first strain comprises a tensile strain in the collector and the base, and the second strain comprises a compressive strain in the base.

4. A semiconductor device, comprising:
   a collector region;
   a base region formed on a collector region;
   an emitter region formed on the base region;
   a first conformal straining film, formed entirely over the base region, providing a first strain in an adjoining region formed on a side of the collector region and the base region; and
   a second straining film providing a second strain in an adjoining region formed on the top of the base region and next to a side of the emitter region, wherein the semiconductor device comprises an PNP transistor and the first strain is a compressive strain in the collector region and an extrinsic region of the base region, and the second strain is a tensile strain in the extrinsic region of the base region.

5. A semiconductor device, comprising:
   a collector region;
   a base region formed on a collector region;
   an emitter region formed on the base region;
   a first conformal straining film providing a first strain in an adjoining region formed on a side of the collector region and the base region;
   a neutral region surrounding the collector region;
   wherein the base region is on top of the neutral doped region;
   an emitter cap on top of the base region; and
   a strain film on a top of the emitter cap,
   wherein the strain film sits directly on top of an oxide region above the emitter cap.

6. The semiconductor device of claim 5, wherein the strain film is allowed to relax after the strain film is applied.

7. A semiconductor device, comprising:
   a collector region;
   a base region formed on a collector region;
   an emitter region formed on the base region;
   a first conformal straining film providing a first strain in an adjoining region formed on a side of the collector region and the base region;
   a neutral region surrounding the collector region;
   wherein the base region is on top of the neutral doped region;
   an emitter cap on top of the base region;
   a strain film on a top of the emitter cap; and
   an emitter oxide formed over the strain film and a polysilicon film formed over the emitter.

8. The semiconductor device of claim 7, wherein the first conformal straining film is over the polysilicon film.

9. The semiconductor device of claim 8, further comprising an oxide spacer on a lower portion of the first conformal straining film.

10. A semiconductor device, comprising:
    a collector region;
    a base region formed on a collector region;
    an emitter region formed on the base region;
    a first conformal straining film, formed entirely over the base region, providing a first strain in an adjoining region formed on a side of the collector region and the base region;
    a neutral doped region surrounding the collector region, wherein the base region is on top of the neutral doped region; and
    an emitter cap on top of the base region,
    wherein portions of the emitter cap above the collector are devoid of the first conformal straining film.

* * * * *